(12) United States Patent
Lee et al.

(10) Patent No.: US 10,333,041 B2
(45) Date of Patent: Jun. 25, 2019

(54) INTEGRATED LIGHT-EMITTING PACKAGE

(71) Applicant: LG INNOTEK CO., LTD., Seoul (KR)

(72) Inventors: In Jae Lee, Seoul (KR); Won Jin Kim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 15/746,721

(22) PCT Filed: Jul. 21, 2016

(86) PCT No.: PCT/KR2016/007947
§ 371 (c)(1),
(2) Date: Jan. 22, 2018

(87) PCT Pub. No.: WO2017/014574
PCT Pub. Date: Jan. 26, 2017

(65) Prior Publication Data
US 2018/0212122 A1  Jul. 26, 2018

(30) Foreign Application Priority Data

Jul. 21, 2015 (KR) .................. 10-2015-0102980

(51) Int. Cl.
*H01L 33/62* (2010.01)
*H01L 33/36* (2010.01)
(Continued)

(52) U.S. Cl.
CPC .......... *H01L 33/62* (2013.01); *H01L 25/0753* (2013.01); *H01L 33/36* (2013.01);
(Continued)

(58) Field of Classification Search
CPC ....... H01L 33/62; H01L 33/36; H01L 33/504; H01L 33/64; H01L 33/58; H01L 33/644;
(Continued)

(56) References Cited

U.S. PATENT DOCUMENTS 6,970,489 B2 * 11/2005 Shimonaka ............ B82Y 20/00
257/E31.108
7,714,341 B2 * 5/2010 Chil Keun ............ H01L 25/167
257/100
(Continued)

FOREIGN PATENT DOCUMENTS

EP  1 914 811 A1  4/2008
EP  2 657 967 A2  10/2013
(Continued)

OTHER PUBLICATIONS

International Search Report in International Application No. PCT/KR2016/007947, filed Jul. 21, 2016.
(Continued)

*Primary Examiner* — Ida M Soward
(74) *Attorney, Agent, or Firm* — Saliwanchik, Lloyd & Eisenschenk

(57) ABSTRACT

An integrated light-emitting package is provided for excellent light extraction efficiency and heat dissipation effect. The integrated light-emitting package includes: a light-emitting element layer including a plurality of light-emitting units arranged at predetermined intervals; an optical conversion substrate disposed along the upper portion of the light-emitting device layer; and a first adhesive member disposed in each gap between the light-emitting units.

19 Claims, 3 Drawing Sheets

(51) Int. Cl.
   *H01L 33/50*   (2010.01)
   *H01L 33/64*   (2010.01)
   *H01L 33/58*   (2010.01)
   *H01L 25/07*   (2006.01)
   *H01L 25/16*   (2006.01)
   *H01L 25/075*  (2006.01)
   *H01L 33/56*   (2010.01)

(52) U.S. Cl.
   CPC ............ *H01L 33/504* (2013.01); *H01L 33/64* (2013.01); *H01L 25/167* (2013.01); *H01L 33/507* (2013.01); *H01L 33/56* (2013.01); *H01L 33/58* (2013.01); *H01L 33/644* (2013.01); *H01L 33/647* (2013.01)

(58) Field of Classification Search
   CPC .. H01L 33/647; H01L 25/0753; H01L 25/167
   See application file for complete search history.

(56) References Cited

U.S. PATENT DOCUMENTS

| | | | |
|---|---|---|---|
| 8,043,876 B2* | 10/2011 | Lee | B29C 43/18 |
| | | | 438/110 |
| 8,519,426 B2* | 8/2013 | Lee | H01L 33/486 |
| | | | 257/100 |
| 9,041,013 B2* | 5/2015 | Lee | H01L 33/486 |
| | | | 257/100 |
| 9,157,579 B2* | 10/2015 | Liu | F21K 9/00 |
| 9,219,208 B2* | 12/2015 | Yoon | H01L 33/62 |
| 9,343,643 B2* | 5/2016 | Hayashi | H01L 33/62 |
| 9,627,598 B2* | 4/2017 | Miyoshi | H01L 33/486 |
| 2005/0057176 A1* | 3/2005 | Lu | H01L 27/322 |
| | | | 315/169.3 |
| 2009/0134415 A1* | 5/2009 | Morioka | H01L 33/56 |
| | | | 257/98 |
| 2010/0320479 A1* | 12/2010 | Minato | H01L 33/505 |
| | | | 257/88 |
| 2014/0131753 A1* | 5/2014 | Ishida | H01L 25/0753 |
| | | | 257/98 |
| 2014/0212995 A1* | 7/2014 | Yoon | H01L 21/561 |
| | | | 438/15 |
| 2014/0226345 A1 | 8/2014 | Song et al. | |
| 2015/0340574 A1* | 11/2015 | Tamaki | H01L 33/505 |
| | | | 257/98 |
| 2017/0102127 A1* | 4/2017 | Woodgate | F21K 9/00 |
| 2017/0200868 A1* | 7/2017 | Nakabayashi | H01L 33/486 |
| 2017/0317247 A1* | 11/2017 | Lee | H01L 33/005 |

FOREIGN PATENT DOCUMENTS

| | | |
|---|---|---|
| JP | 2003-031848 A | 1/2003 |
| JP | 2010-123918 A | 6/2010 |
| JP | 2014-140014 A | 7/2014 |
| JP | 2015-076594 A | 4/2015 |
| KR | 10-2015-0061544 A | 6/2015 |

OTHER PUBLICATIONS

Supplementary European Search Report dated Nov. 29, 2018 in European Application No. 16828078.2.
McDonald, J., "Advanced Silicone Materials for LED Lighting," *DOE SSL R&D Workshop*, Jan. 28, 2015, pp. 1-14.

* cited by examiner

INTEGRATED LIGHT-EMITTING PACKAGE

CROSS-REFERENCE TO RELATED APPLICATIONS

This application is the U.S. national stage application of International Patent Application No. PCT/KR2016/007947, filed Jul. 21, 2016, which claims priority to Korean Application No. 10-2015-0102980, filed Jul. 21, 2015, the disclosures of each of which are incorporated herein by reference in their entirety.

TECHNICAL FIELD

Exemplary embodiments of the present invention relate to an integrated light-emitting package having improved light extraction efficiency.

BACKGROUND ART

Light-emitting diode units, such as light-emitting diodes (LEDs) or laser diodes (LDs) using compound semiconductor materials of group III-V or group II-VI semiconductors, can implement ultraviolet rays and a variety of colors including red, green, and blue by developing thin film growth technology and element materials, and achieve white light rays having high efficiency by using phosphor materials or a combination of colors.

Compared to incandescent bulbs, fluorescent lights, neon lights, etc., a LED has lower power consumption, and has advantages of excellent visibility and low glare due to high color temperature. A lamp utilizing a LED can be applied to a backlight, a display device, a light, a car light, or a headlamp according to the usage thereof.

A light-emitting unit such as the recent LED is emerging as an important research topic in terms of energy efficiency.

Further, because an energy conversion ratio in an LED chip is about 15% or less and the approximately remaining 85% of electrical energy is converted into thermal energy and consumed, heat dissipation is very important.

Although conventional LED chips have used metal particles such as $TiO_2$ to solve the above problems, the metal particles have caused problems of internal electrical discharge and partial electrical discharge.

DISCLOSURE

Technical Problem

Embodiments of the present invention are directed to providing an integrated light-emitting package having excellent light extraction efficiency and an excellent heat dissipation effect.

Technical Solution

The embodiments described herein provide an integrated light-emitting package that includes a light-emitting element layer including a plurality of light-emitting units spaced a predetermined interval from each other, an optical conversion substrate provided along an upper portion of the light-emitting element layer, and a first adhesive member provided in a separation space between the plurality of light-emitting units.

Advantageous Effects

An integrated light-emitting package according to an exemplary embodiment of the present invention has improved light extraction efficiency by applying an adhesive member between a plurality of light-emitting units.

Also, an integrated light-emitting package can have improved light extraction efficiency and heat dissipation efficiency by adding ceramic materials, such as BN, to an adhesive member.

MODES OF THE INVENTION

Hereinafter, exemplary embodiments of the present invention will be described in detail with reference to the accompanying drawings so that a person of ordinary skill in the art may embody and practice the present invention easily. However, it will be understood that the exemplary embodiments described in this disclosure and the structures illustrated in the accompanying drawings are only preferred exemplary embodiments, and there may be various equivalents and modifications thereof at the time of filing the present application. Also, when detailed descriptions of well-known functions or configurations related to the present invention unnecessarily obscures the gist of the present invention when explaining the operating principles about the exemplary embodiments of the present invention, the detailed description thereof will be omitted. The terminology used herein is defined in terms of functionality in the present invention and the meaning thereof should be interpreted based on the contents throughout this specification.

Figure 1:
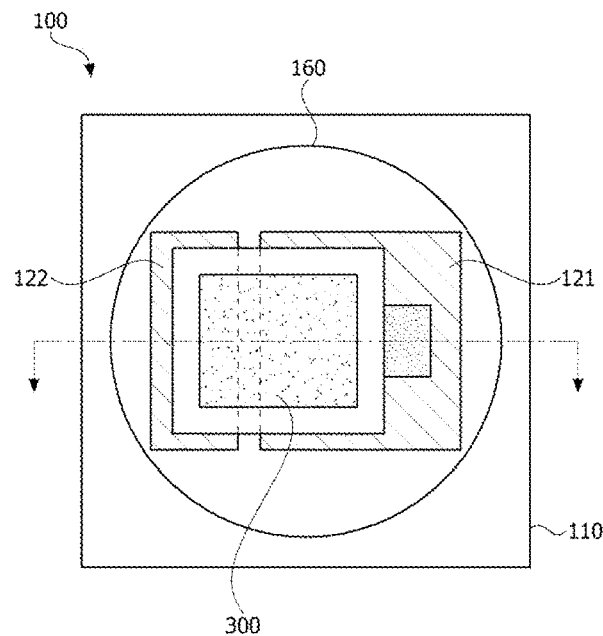
FIG. 1 illustrates a plan view of an integrated light-emitting package according to an exemplary embodiment of the present invention.
Figure 2:
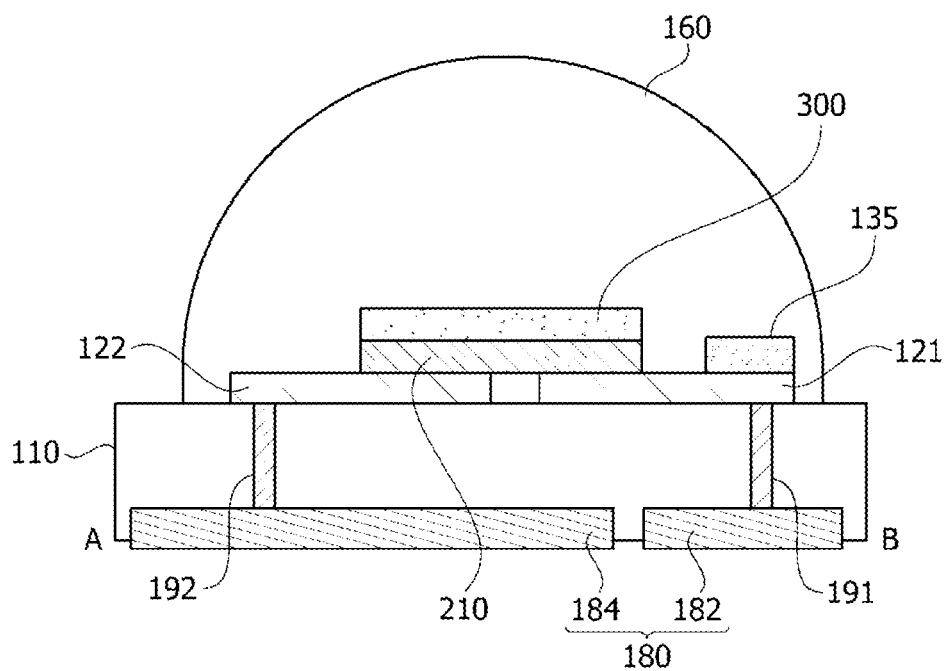
FIG. 2 illustrates a cross-sectional view of the integrated light-emitting package, which is taken along line AB of FIG. 1.
Figure 3:
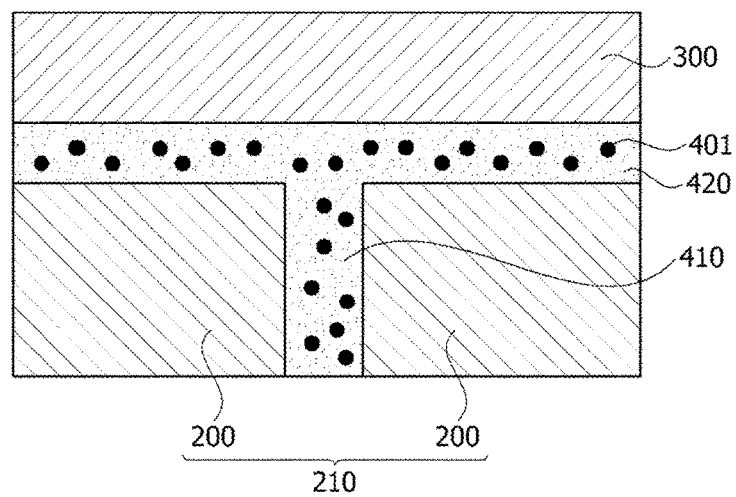
FIG. 3 illustrates a partially enlarged view of an integrated light-emitting package according to the exemplary embodiment of the present invention.

FIG. 1 is a plan view of an integrated light-emitting package according to an exemplary embodiment of the present invention, FIG. 2 is a cross-sectional view of the integrated light-emitting package, which is taken along line AB of FIG. 1, and FIG. 3 is a partially enlarged view of an integrated light-emitting package according to the exemplary embodiment of the present invention.

Referring to FIGS. 1 to 3, an integrated light-emitting package 100 of the present invention includes a substrate 110, first and second lead frames 121 and 122, a light-emitting element layer 210, a Zener diode 135, a optical conversion substrate 300, a lens 160, a heat sink electrode 180, and vias 191 and 192.

The substrate 110 may be a substrate with high insulation or thermal conductivity, such as a silicon substrate, a silicon carbide (SiC) substrate, an aluminum nitride (AlN) substrate, or a ceramic substrate (for example, $Al_2O_3$). Also, the substrate 110 may be made of a resin material such as polyphthalamide (PPA) having high reflectivity. In addition, the substrate 110 may have a monolayer structure or a multilayer structure.

The first and second lead frames 121 and 122 may be disposed to be spaced apart from each other on the substrate 110 so as to be electrically separated from each other. For instance, the first and second lead frames 121 and 122 may be spaced apart from each other on a top surface of the substrate 110.

The first and second lead frames 121 and 122 may reflect light emitted from a light-emitting unit 200.

For example, the first and second lead frames 121 and 122 may be formed of one of titanium (Ti), copper (Cu), nickel (Ni), gold (Au), chromium (Cr), tantalum (Ta), platinum (Pt), tin (Sn), silver (Ag), phosphorus (P), or an alloy thereof, and have a monolayer structure or multilayer structure.

The light-emitting element layer 210 may be electrically connected to the first and second lead frames 121 and 122. For instance, the light-emitting element layer 210 may be disposed on the upper portion of at least one of the first or second lead frames 121 or 122. The light-emitting element layer 210 may be configured to include a plurality of light-emitting units 200 that are spaced a predetermined interval from each other. The light-emitting unit 200 may generate light (for example, blue light) having a wavelength of 380 nm to 490 nm with a light-emitting diode, but is not limited thereto.

The light-emitting element layer 210 may be bonded to at least one of the first and second lead frames 121 and 122 by die bonding, which includes paste bonding for attaching a chip to the substrate 110 with an adhesive (for example, Ag paste, silicone), eutectic bonding for forming a metal (for example, Au/Sn) on a chip pad and attaching the metal to the substrate at high temperature, and flip chip bonding for directly connecting a chip pad and a pad of the substrate 110 with a solder.

The Zener diode 135 is disposed on any one of the first and second lead frames 121 and 122 so as to provide a constant voltage to the light-emitting unit 200. For example, the Zener diode 135 may be disposed on a top surface of the first lead frame 121.

The optical conversion substrate 300 is provided along the upper portion of the light-emitting element layer 210 and converts the wavelength of light generated by the light-emitting unit 200. The optical conversion substrate 300 may be made of a combination of a phosphor and a resin. The resin for the optical conversion substrate 300 may be a transparent thermosetting resin with high hardness and reliability, for example, a silicone resin, an epoxy resin, glass, a glass ceramic, a polyester resin, an acrylic resin, urethane resin, nylon resin, polyamide resin, polyimide resin, vinyl chloride resin, a polycarbonate resin, a polyethylene resin, a Teflon resin, a polystyrene resin, a polypropylene resin, a polyolefin resin, etc.

The optical conversion substrate 300 may include one or more types of phosphors and contain at least one of a silicate-based phosphor, a YAG-based phosphor, and a nitride-based phosphor.

For instance, the phosphor of the optical conversion substrate 300 may be, but is not limited to, an amber phosphor, and may include at least one of a blue phosphor, a green phosphor, a red phosphor, and an amber phosphor.

The optical conversion substrate 300 may be provided along the upper portion of the light-emitting element layer 210 by coating, such as conformal coating, dispensing, etc.

An integrated optical conversion substrate 300 according to the exemplary embodiment of the present invention may be a single integrated optical conversion substrate 300 stacked on the upper portion of the plurality of light-emitting units 200, as illustrated in FIG. 1.

The optical conversion substrate 300 according to the exemplary embodiment of the present invention may be configured to contain a fluorescent material therein, and substrates of various light transmitting materials may be applied thereas. In the exemplary embodiment of the present invention, a ceramic substrate is described as an example of the optical conversion substrate. The phosphor material contained in the integrated optical conversion substrate 300 may be configured to include phosphorescent materials that can convert the excitation light of the light-emitting unit 200 into converted light. Specifically, the phosphor material may include at least one of an amber phosphor, a green phosphor, and a red phosphor. The amber phosphor emits light having a dominant wavelength ranging from 540 nm to 585 nm in response to blue light (430 nm to 480 nm). The green phosphor emits light having a dominant wavelength ranging from 510 nm to 535 nm in response to blue light (430 nm to 480 nm). The red phosphor emits light having dominant wavelength ranging from 600 nm to 650 nm in response to blue light (430 nm to 480 nm). The amber phosphor may be a silicate-based or YAG-based phosphor, the green phosphor may be a silicate-based, a nitride-based, or a sulfide-based phosphor, and the red phosphor may be a nitride-based or sulfide-based phosphor.

As illustrated in FIG. 3, a first adhesive member 410 is provided between the plurality of light-emitting units 200, and a second adhesive member 420 is provided between the light-emitting element layer 210 and the optical conversion substrate 300, which may result in a structure in which the light-emitting element layer 210 and the optical conversion substrate 300 are bonded through the second adhesive member 420. Conventionally, a plurality of light-emitting units have been configured to be separately attached to an individual optical conversion substrate through an adhesive member and there were air gaps among the individual light-emitting units. This conventional structure caused a loss of light because light emitted from the individual light-emitting units leaked sideways.

Thus, in the exemplary embodiments of the present invention, the loss of light can be reduced and luminous flux can be improved by arranging the first adhesive member 410 in a space between the plurality of light-emitting units 200. The first adhesive member 410 may be configured to include a silicone resin and may have a refractive index ranging from 1.4 to 1.6. The first adhesive member 410 may include, for example, a methyl silicone or phenyl silicone resin. The methyl silicone or phenyl silicone resin can not only improve the extraction efficiency of light emitted between the individual light-emitting units 200 due to a high refractive index thereof, but also forms a stable light-emitting package due to high thermal resistance thereof. Moreover, the methyl silicone or phenyl silicone resin ensures a stable dispersion of ceramic powder 401 contained in the first adhesive member 410, and is compounded with the ceramic powder 401, thereby accomplishing superior light extraction efficiency and a superior heat dissipation effect.

The viscosity of the first adhesive member 410 may range from 3000 cps to 8000 cps. Here, cps is a unit of viscosity. When the viscosity of the first adhesive member 410 is less than 3000 cps, the first adhesive member 410 may flow down from the side of the light-emitting unit 200 and collapse. When the viscosity of the first adhesive member 410 is more than 8000 cps, uniform application of the first adhesive member 410 may become difficult due to high thixotropy.

The second adhesive member 420 may be disposed between the light-emitting element layer 210 and the optical conversion substrate 300. The second adhesive member 420 fixes the light-emitting element layer 210 and the optical conversion substrate 300, and may include a silicone resin. The second adhesive member 420 may include, for example, a methyl silicone or phenyl silicone resin, and the refractive index of the first adhesive member 410 may be higher than that of the second adhesive member 420. In other words, the first adhesive member 410 may have a higher refractive index than the second adhesive member 420 so as to refract light emitted to the sides of the light-emitting unit 200 toward the optical conversion substrate 300.

The following Table 1 shows test results on luminous flux and color coordinates of the integrated light-emitting package 100 according to exemplary embodiments of the present invention. The test was performed with classification into a single light-emitting unit and a plurality of light-emitting units according to the exemplary embodiments of the present invention, and was conducted with an adhesive member among the plurality of light-emitting units (Exemplary Embodiment) and without (Comparative Example).

The combination of the adhesive member 410, the second adhesive member 420, and the ceramic powder 401 can improve the luminous flux emitted from the light-emitting unit 200, thereby increasing light extraction efficiency, and disperse or extract heat generated by the light-emitting unit 200 to the outside due to a heat dissipation function of the ceramic powder 401.

Preferably, the ceramic powder 401 may be BN powder. The BN powder may be contained in an amount of 10 to 40 parts by weight based on 100 parts by weight of the adhesive member. When the content of the ceramic powder is less than 10 parts by weight, the light extraction efficiency drops sharply, and when the content of the ceramic powder is more than 40 parts by weight, the light extraction efficiency decreases, thereby making the improvement in the heat dissipation effect insignificant. In other words, when the content of the BN powder ranges from 10 to 40 parts by weight, based on 100 parts by weight of the adhesive member, the light extraction efficiency and heat dissipation efficiency are both excellent.

The following Table 2 shows test results on luminous flux depending on BN powder content, i.e., light extraction improvement.

TABLE 1

| | Classification | | Luminous flux (lm) | Color coordinates Cx | Color coordinates Cy | Rank |
|---|---|---|---|---|---|---|
| | A single light-emitting unit | | 1599 | 0.3319 | 0.3512 | AG |
| Integrated light-emitting unit | Two light-emitting units | Without an adhesive member between the light-emitting units (Comparative Example) | 1594 | 0.3321 | 0.3544 | AG |
| | | With an adhesive member between the light-emitting units (Exemplary Embodiment) | 1661 | 0.3323 | 0.3565 | AG |
| | Three light-emitting units | Without an adhesive member among the light-emitting units (Comparative Example) | 1597 | 0.3319 | 0.3512 | AG |
| | | With an adhesive member among the light-emitting units (Exemplary Embodiment) | 1655 | 0.3346 | 0.3544 | AG |
| | Four light-emitting units | Without an adhesive member among the light-emitting units (Comparative Example) | 1595 | 0.3319 | 0.3512 | AG |
| | | With an adhesive member among the light-emitting units (Exemplary Embodiment) | 1652 | 0.3330 | 0.3529 | AG |

From the test results of Table 1, it can be seen that the luminous flux increases when the adhesive member is present among the plurality of light-emitting units. In other words, light lost among the light-emitting units is directed upward by the adhesive member, thereby increasing luminous flux and improving a light extraction effect and light utilization efficiency.

The exemplary embodiment of the present invention may include ceramic powder 401 in the first adhesive member 410 and the second adhesive member 420. The ceramic powder 401 may be at least one of AlN, Al$_2$O$_3$, BN, SiC, and BeO powder.

Because the ceramic powder 401 has high thermal conductivity and insulation and is inexpensive compared to metal particles such as TiO$_2$ used conventionally in the art, it can solve problems such as electrical discharge caused by the metal particles.

TABLE 2

| BN content (parts by weight) | Luminous flux (lm) | Color coordinates Rank |
|---|---|---|
| 5 | 1,570 | AG |
| 10 | 1,645 | AG |
| 15 | 1,651 | AG |
| 25 | 1,656 | AG |
| 40 | 1,639 | AG |
| 45 | 1,540 | AG |

As described in Table 2, it can be seen that when the content of the BN powder is 10 to 40 parts by weight, the light extraction efficiency shows critical changes. Also, it can be seen that when the content of the BN powder is 10 to 40 parts by weight, the heat dissipation function is maximized along with the light extraction efficiency. It is expected that the optimum content of the BN powder influences aggregation and dispersibility, thereby affecting light extraction efficiency and the heat dissipation function.

The average diameter of the BN powder is preferably 10 μm to 30 μm. When the average diameter is less than 10 μm, the agglomeration of the BN powders becomes excessive, and when the average diameter is more than 30 μm, the light extraction efficiency decreases.

The following Table 3 shows test results on luminous flux depending on the diameter of the BN powder, i.e., light extraction improvement.

TABLE 3

| BN particle size (μm) D50 standard | Luminous flux (lm) | Color coordinates Rank |
|---|---|---|
| 5 | 1,550 | AG |
| 10 | 1,657 | AG |
| 20 | 1,662 | AG |
| 30 | 1,645 | AG |
| 40 | 1,540 | AG |

As described in Table 3, it can be seen that the light extraction efficiency shows critical changes depending on the diameter of the BN powder. Therefore, as described above, it is expected that the optimum diameter of the BN powder influences aggregation and dispersibility, thereby affecting light extraction efficiency and the heat dissipation function.

In the exemplary embodiments of the present invention, the number of the plurality of light-emitting units 200 is not particularly limited, and two to four light-emitting units are integrated in consideration of the easy application of the adhesive members 410 and 420 and productivity.

The lens 160 is disposed on the substrate 110, and may seal the optical conversion substrate 300 and light-emitting element layer 210 and refract light emitted from the light-emitting unit 200.

For example, the lens 160 may refract light, of which wavelength has been converted by the optical conversion substrate 300, and change a path of the light.

The lens 160 may have a hemispherical shape or a dome shape, but is not limited thereto.

The lens 160 may be formed of silicone having high tolerance to heat generated by the light-emitting unit 200, such as silicone with a benzene ring, but is not limited thereto. This is because when the shape of the lens 160 is deformed or damaged by heat of the light-emitting unit 200, the desired angle of light departure cannot be obtained.

A bottom surface of the lens 160 may be in contact with the top surface of the substrate 110, the top surfaces of the first and second lead frames 121 and 122, and the top surface of the optical conversion substrate 300.

The heat radiating electrode 180 may be disposed on a back surface of the substrate 110.

The heat radiating electrode 180 may be made of a material having high thermal conductivity, and may serve as a path for emitting the heat generated by the light-emitting package 100.

The number of heat radiating electrodes 180 may be a plurality, and a plurality of heat radiating electrodes (for example, 182 and 184) may be disposed so as to be spaced apart from each other on the back surface of the substrate 110.

The vias 191 and 192 may pass through the substrate 110 and connect the first and second lead frames 121 and 122 and the heat radiating electrodes 182 and 184. For instance, the vias 191 and 192 may pass through electrodes that are formed by filling a conductive material in via holes provided in the substrate 110.

For example, by passing through the substrate 110, a first via 191 may connect the first lead frame 121 and the first heat radiating electrode 182, and a second via 192 may connect the second lead frame 122 and the second heat radiating electrode 184.

In this case, the first and second lead frames 121 and 122 may function as upper electrodes disposed on the upper portion of the substrate 110, the first and second heat radiating electrodes 182 and 184 may function as lower electrodes disposed on the bottom of the substrate 110, and the vias 191 and 192 may connect the upper electrodes and the lower electrodes. In another exemplary embodiment, the substrate 110 may not be passed through, and the first and second lead frames 121 and 122 and the heat radiating electrodes 182 and 184 may be connected to each other through connecting electrodes (not shown) disposed on the outer peripheral surface of the substrate 110.

Figure 4:
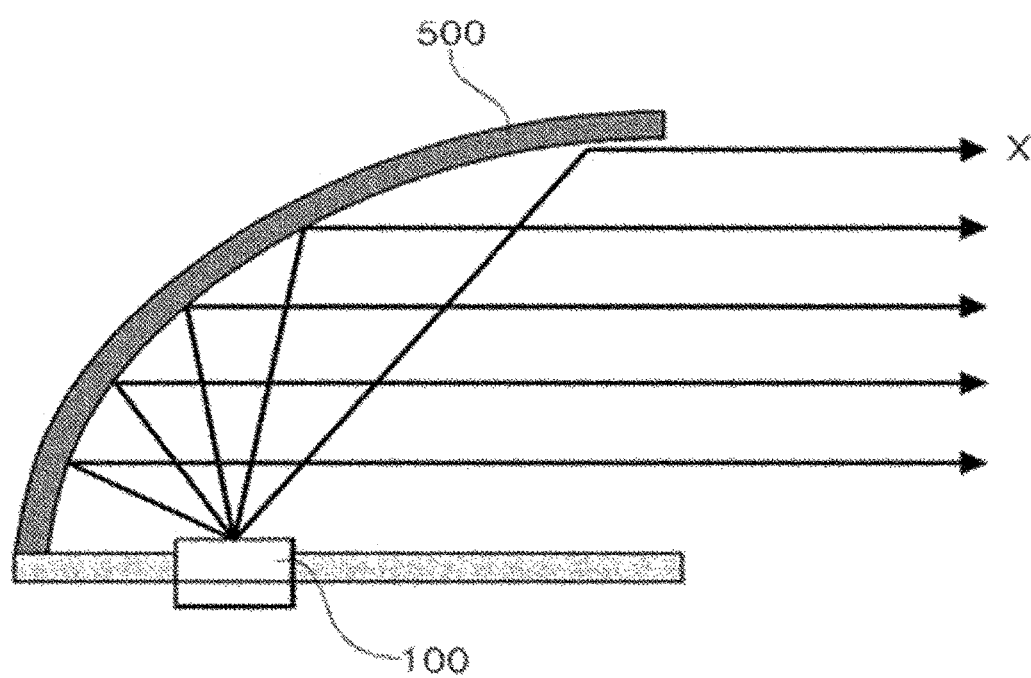
FIG. 4 illustrates a conceptual diagram of a structure of a car headlamp to which the integrated light-emitting package (100) according to the exemplary embodiment of the present invention is applied.

FIG. 4 illustrates a conceptual diagram of a structure of a car headlamp to which an integrated light-emitting package 100 according to the exemplary embodiment of the present invention is applied.

Because light emitted from a plurality of light-emitting units 200 is converted in the optical conversion substrate 300, some of the converted light moves toward a reflector 500, and the converted light X moving toward the integrated light-emitting package 100 returns to the reflector 500 and departs, a lamp for a car which has improved light concentration and optical conversion efficiency can be implemented.

Figure 5:
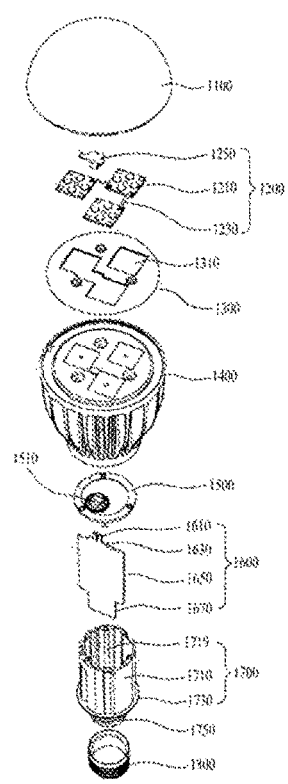
FIG. 5 illustrates a lighting device including the integrated light-emitting package according to the exemplary embodiment of the present invention.

FIG. 5 illustrates a lighting device including the integrated light-emitting package according to the exemplary embodiment of the present invention.

Referring to FIG. 5, the lighting device may include a cover 1100, a light source module 1200, a heat sink 1400, a power supply 1600, an inner case 1700, and a socket 1800. Also, the lighting device according to the exemplary embodiment of the present invention may further include at least one of a member 1300 and a holder 1500.

The cover 1100 may have a shape of a bulb or hemisphere, and may have a shape that is hollow and partially opened. The cover 1100 may be optically coupled with the light source module 1200. For example, the cover 1100 may diffuse, scatter, or excite light provided by the light source module 1200. The cover 1100 may be a type of optical member. The cover 1100 may be coupled with the heat radiator 1400. The cover 1100 may include a coupling portion that engages with the heat radiator 1400.

The inner surface of the cover 1100 may be coated with milky paint. The milky paint may include a diffusion material that diffuses light. The surface roughness of an inner surface of the cover 1100 may be formed to be higher than that of an outer surface of the cover 1100. This is to sufficiently scatter and diffuse light from the light source module 1200 so as to release the light to the outside.

A material of the cover 1100 may be glass, plastic, polypropylene (PP), polyethylene (PE), polycarbonate (PC), etc. Here, polycarbonate has excellent light fastness, heat resistance, and strength. The cover 1100 may be transparent so that the light source module 1200 is visible from the outside, but is not limited thereto and may be opaque. The cover 1100 may be formed through blow molding.

The light source module 1200 may be disposed on a surface of the heat radiator 1400, and heat generated by the light source module 1200 may be conducted to the heat radiator 1400. The light source module 1200 may include a light source portion 1210, a connecting plate 1230, and a connector 1250.

The light source portion 1210 may include the light-emitting package 100 according to the exemplary embodiment of the present invention.

The member 1300 may be disposed on the top surface of the heat radiator 1400, and has a guide groove 1310 into which a plurality of light source portions 1210 and the connector 1250 are inserted. The guide groove 1310 may correspond to or be aligned with the substrate of the light source portions 1210 and the connector 1250.

A surface of the member 1300 may be deposited or coated with a light reflecting material.

For example, the surface of the member 1300 may be deposited or coated with white paint. The member 1300 may reflect light, which is reflected by the inner surface of the cover 1100 and returns toward the light source module 1200, toward the cover 1100 again. Thus, the light efficiency of the lighting device according to the exemplary embodiment of the present invention can be improved.

The member 1300 may be made of, for example, an insulating material. The connecting plate 1230 of the light source module 1200 may include an electrically conductive material. Accordingly, an electrical contact may be formed between the heat radiator 1400 and the connecting plate 1230. The member 1300 may be made of an insulating material, thereby blocking electrical short-circuits. The heat radiator 1400 may receive and dissipate the heat from the light source module 1200 and the heat from the power supply 1600.

The holder 1500 closes a receiving groove 1719 in an insulating portion 1710 of the inner case 1700. Thus, the power supply 1600 received in the insulating portion 1710 of the inner case 1700 can be sealed. The holder 1500 may have a guide protrusion 1510, and the guide protrusion 1510 may have a hole through which a protrusion 1610 of the power supply 1600 passes.

The power supply 1600 processes or converts electrical signals received from the outside and provides the electrical signals to the light source module 1200. The power supply 1600 may be received in the receiving groove 1719 of the inner case 1700, and may be sealed inside the inner case 1700 by the holder 1500. The power supply 1600 may include a protrusion 1610, a guide portion 1630, a base 1650, and an extension portion 1670.

The guide portion 1630 may have a shape protruding outward from one side of the base 1650. The guide portion 1630 may be inserted into the holder 1500. A plurality of components may be disposed on one side of the base 1650. The plurality of components may include, for example, a direct current (DC) converter for converting alternating current (AC) power provided by an external power source into DC power, a driving chip for controlling driving of the light source module 1200, and an electrostatic discharge (ESD) protective element for protecting the light source module 1200, but the present invention is not limited thereto.

The extension portion 1670 may have a shape protruding outward from another side of the base 1650. The extension portion 1670 may be inserted into a connecting portion 1750 of the inner case 1700 and may be provided with electrical signals from the outside. For instance, the extension portion 1670 may have the same width as or a smaller width than the connecting portion 1750 of the inner case 1700. One end of a "+ wire" and a "−wire" may be electrically connected to the extension portion 1670, and the other end of the "+ wire" and "−wire" may be electrically connected to the socket 1800.

The inner case 1700 may include a molding portion along with the power supply 1600 therein. The molding portion is a portion at which the molding liquid is cured, and allows the power supply 1600 to be fixed inside the inner case 1700.

In the foregoing detailed description of the present invention, specific exemplary embodiments have been described. However, various modifications are possible within the spirit and scope of the present invention. It should be noted that the technical idea of the present invention is not limited to the above-described exemplary embodiments of the present invention, but is determined by the following claims and equivalents thereof.

EXPLANATION OF SYMBOLS

100: integrated light-emitting package
200: light-emitting unit
210: light-emitting element layer
300: optical conversion substrate
410: first adhesive member
420: second adhesive member
401: ceramic powder
500: reflector

The invention claimed is:

1. An integrated light-emitting package comprising:
   a light-emitting element layer including a plurality of light-emitting units disposed to be spaced a predetermined interval from each other;
   an optical conversion substrate provided along an upper portion of the light-emitting element layer; and
   a first adhesive member provided in a space between the plurality of light-emitting units,
   wherein the first adhesive member includes a silicone resin.

2. The integrated light-emitting package of claim 1, wherein the silicone resin includes at least one of methyl silicone and phenyl silicone.

3. The integrated light-emitting package of claim 1, wherein the first adhesive member further includes ceramic powder.

4. The integrated light-emitting package of claim 3, wherein the ceramic powder includes at least one of AlN, $Al_2O_3$, BN, SiC, and BeO powder.

5. The integrated light-emitting package of claim 4, wherein the ceramic powder includes BN powder.

6. The integrated light-emitting package of claim 5, wherein the BN powder is contained in an amount of 10 to 40 parts by weight based on 100 parts by weight of the first adhesive member.

7. The integrated light-emitting package of claim 5, wherein individual particles of the BN powder have a diameter of 10 μm to 30 μm.

8. The integrated light-emitting package of claim 1, wherein the light-emitting element layer includes two to four light-emitting units that are spaced a predetermined interval from each other.

9. The integrated light-emitting package of claim 1, wherein the first adhesive member has a refractive index of 1.4 to 1.6.

10. The integrated light-emitting package of claim 1, further comprising:
    a second adhesive member disposed between the light-emitting element layer and the optical conversion substrate.

11. The integrated light-emitting package of claim 10, wherein the first adhesive member, the light-emitting unit, and the second adhesive member have different refractive indices.

12. The integrated light-emitting package of claim 11, wherein the refractive index of the first adhesive member is higher than the refractive index of the second adhesive member.

13. The integrated light-emitting package of claim 1, wherein the first adhesive member has a viscosity of 3000 cps to 8000 cps.

14. An integrated light-emitting package comprising:
a substrate;
first and second lead frames disposed to be spaced apart from each other on the substrate;
a light-emitting element layer including a plurality of light-emitting units that are disposed on an upper portion of at least one of the first and second lead frames and spaced a predetermined interval from each other;
an optical conversion substrate provided along an upper portion of the light-emitting element layer;
a Zener diode disposed on an upper portion of any one of the first and second lead frames;
a lens disposed on the substrate and configured to seal the optical conversion substrate and light-emitting element layer;
a heat radiating electrode disposed on a bottom surface of the substrate;
a via configured to pass through the substrate and connect the first and second lead frames to the heat radiating electrode; and
a first adhesive member provided in a space between the plurality of light-emitting units.

15. The integrated light-emitting package of claim 14, wherein the first adhesive member further includes ceramic powder.

16. The integrated light-emitting package of claim 15, wherein the ceramic powder includes at least one of AlN, $Al_2O_3$, BN, SiC, and BeO powder.

17. The integrated light-emitting package of claim 16, wherein the ceramic powder includes BN powder.

18. The integrated light-emitting package of claim 17, wherein the BN powder is contained in an amount of 10 to 40 parts by weight based on 100 parts by weight of the first adhesive member.

19. The integrated light-emitting package of claim 17, wherein individual particles of the BN powder have a diameter of 10 μm to 30 μm.

* * * * *